United States Patent [19]
Heil

[11] Patent Number: 5,273,636
[45] Date of Patent: Dec. 28, 1993

[54] COATING APPARATUS

[75] Inventor: Walter Heil, Neuberg, Fed. Rep. of Germany

[73] Assignee: Leybold Aktiengesellschaft, Hanau, Fed. Rep. of Germany

[21] Appl. No.: 899,461

[22] Filed: Jun. 16, 1992

[30] Foreign Application Priority Data

Jan. 18, 1992 [DE] Fed. Rep. of Germany ....... 4201211

[51] Int. Cl.$^5$ ............................................. C23C 14/34
[52] U.S. Cl. .......................... 204/298.15; 204/298.09;
204/298.11; 204/298.28; 118/500
[58] Field of Search ................... 204/298.09, 298.11,
204/298.15, 298.23, 298.28; 156/345; 118/500

[56] References Cited
U.S. PATENT DOCUMENTS 4,230,915 3/1980 Zajac ................................... 156/345
4,439,261 2/1984 Pavone et al. ...................... 156/345
4,851,101 7/1989 Hutchinson ..................... 204/298.09
4,869,801 9/1989 Helms et al. .................... 204/298.15
4,944,860 7/1990 Bramhall et al. .......... 204/298.15 X

FOREIGN PATENT DOCUMENTS 2213316 7/1988 United Kingdom .

Primary Examiner—Nam Nguyen
Attorney, Agent, or Firm—Felfe & Lynch

[57] ABSTRACT

A substrate table (4) is fixed to a rotatably mounted hollow shaft (3) in a vacuum coating tank (1). The shaft (3) has a first portion passing sealingly through a wall of the tank and a second portion which has a larger diameter than the first portion in the tank. The first portion has axial supply passages connected to a chamber in the second portion where electrical connectors and coolant distribution means are housed.

9 Claims, 2 Drawing Sheets

COATING APPARATUS

BACKGROUND OF THE INVENTION

The invention relates to coating apparatus having a tank connected to a high-vacuum pumping system, in which a substrate table is disposed on a rotatably mounted shaft which is introduced through a wall of the tank. The shaft has axial passages through which the supply lines for substrate table are brought out of the tank.

Vacuum coating apparatus of the above kind are known and commonly used as cathode sputtering apparatus. Since a high vacuum must prevail in the tank of such a coating apparatus and the sealing of the rotatable shaft of the substrate table becomes more difficult and less reliable with increasing shaft diameter, it is beneficial to keep the diameter of the shaft as small as possible. However, keeping the shaft diameter small is difficult because in today's apparatus more conduits than formerly have to be brought from the outside through the shaft to the substrate table. The conduits carry water lines for cooling the substrate table, electrical conductors for its heater, conductors for various temperature measuring sensors, or even high-frequency power feeders. Since not only these conduits must be carried in the shaft, but also room for the necessary connections must be provided, such conduits necessitate a considerable and undesirable enlargement of the diameter of the shaft.

The invention is based on the problem of improving a vacuum coating apparatus of the kind described above such that the diameter of the opening that is to be sealed in the tank wall through which the shaft passes can be very small so as to minimize leakage at that point.

SUMMARY OF THE INVENTION

According to the invention, the shaft has a second portion configured as a hollow shaft forming an atmosphere container between the wall through which the shaft passes and the substrate table. This second portion has a diameter which is larger in comparison to the first shaft portion passing through the wall, and the atmosphere container has the space required by connectors for the lines running to the substrate table.

By this configuration, the connectors for the lines, which are substantially larger in cross section than the lines themselves, can be located in the atmosphere container. They therefore do not require any enlargement of the diameter of the shaft in the area in which it passes through the wall of the tank. Therefore, even when there is a comparatively large number of lines carried through the shaft, a good sealing of the tank against the atmosphere is still possible. Furthermore, the atmosphere container makes it possible to increase the number of turntable lines leading out of it, without modification of the turntable shaft.

Often the substrate table has a number of water connections for carrying coolant water in and out, so that several water cooling circuits can be operated parallel. In such a case, in order to avoid the need to bring more than two water lines through the small-diameter portion of the shaft, it is advantageous according to another embodiment of the invention if of one coolant feed line and one coolant return line run through a total of two shaft passages, and one distributor is provided in the atmosphere container on the coolant feed line and the coolant return line for connecting the lines to a plurality of substrate table cooling circuits.

To prevent the formation of a plasma on the outer periphery of the atmosphere container while a coating apparatus configured as a cathode sputtering apparatus is being etched to clean it, it is possible according to another further development of the invention for the atmosphere container to be surrounded at a distance from its outer periphery by a dark-space shield electrically insulated from the atmosphere container.

In the tanks, the number of pass-throughs that have to be sealed is especially small if the shaft is connected to ground and a high-frequency feed line to the substrate table is brought coaxially through the shaft and its atmosphere container.

The portion of the shaft that is of smaller diameter running through the wall of the tank can have an end section reaching into the atmosphere container, with the atmosphere container divided into two confronting chambers by a partition wall joining the end section to the inside wall of the atmosphere container. Through this partitioning of the atmosphere container, connections which are sensitive to high frequency can be disposed in the lower chamber and the rest of the connections can be provided in the other chamber.

Any transfer of the high frequency from the substrate table through the lines carrying the coolant to the grounded shaft of the substrate table can be prevented in a simple manner by high-frequency attenuators without thereby requiring any undesirable increase in the bulk of the atmosphere chamber, if in the upper chamber water hoses run each with at least one spiral from the passage in the shaft to a water connection on the substrate table.

DETAILED DESCRIPTION OF THE PREFERRED EMBODIMENTS

Figure 1:
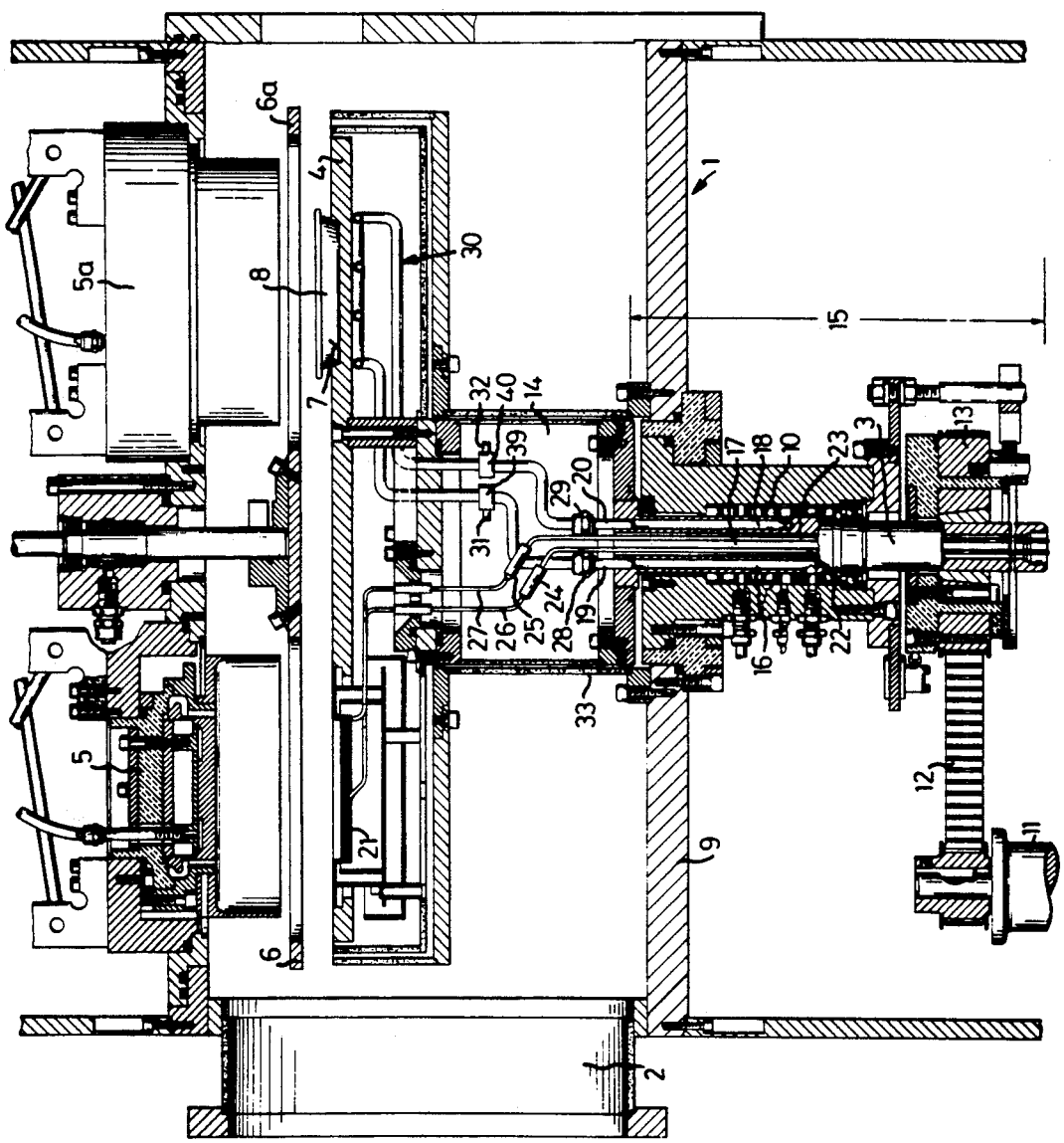
FIG. 1 is a vertical section through a coating apparatus according to a first embodiment of the invention.

FIG. 1 shows a tank 1 of a coating apparatus operating as a cathode sputtering apparatus. It is to be connected by a vacuum connector 2 to a high-vacuum pumping system not shown. Within the tank 1 a substrate table 4 is disposed on an upright shaft 3. Above this substrate table 4 are cathodes 5 and 5a and masks 6 and 6a, so that substrates 8 disposed in the substrate sockets 7 can be coated by sputtering.

The tank 1 has a first bottom 9 through which a portion 15 of the shaft 3 extends. A vacuum seal 10 prevents penetration of air into the tank 1. In the bottom part of FIG. 1 there is represented a motor 11 by which the shaft 3 and with it the substrate table 4 can be rotated by means of a cogbelt 12 and a belt pulley 13.

It is important for the invention that the shaft 3 has a second portion configured as a hollow shaft forming an atmosphere container 14 within the tank 1 between the wall 9 through which first portion 15 passes and the substrate table 4. In the first portion 15 of the shaft 3 can be seen passages 16, 17 and 18. A coolant water feed line 19 runs through the passage 16, a coolant water return line 20 runs through passage 18, and two electrical conductors 22 and 23 supplying electric power to an electrical heater 21 run through the passage 17.

It can be seen in FIG. 1 that two electrical connectors 24 and 25 are disposed in the atmosphere container 14, and they connect the electric conductors 22 and 23 to the wires 26 and 27 coming from the heater 21. Also, FIG. 1 shows two connectors 28 and 29 in the atmosphere container 14, and they are followed by two distributors 39 and 40. The coolant water feed line 19 is connected to fitting 28 and the coolant water return line 20 to fitting 29. Coolant water flows from fitting 28 through the distributor 39 to a water cooling coil 30 of the substrate table 4 and can return through distributor 40 and fitting 29. The distributors 39 and 40 have each an additional fitting 31 and 32, so that an additional water cooling coil, not shown, can be operated parallel with water cooling coil 30.

Whereas during sputtering the shaft 3 with the atmosphere container 14 is connected to ground, during the etch cleaning these parts are connected to high-frequency power. The formation of a plasma on the outer circumference of the atmosphere container 14 is prevented by a dark-space shield 33 which surrounds, at a slight distance away, the outside of the atmosphere container 14 and is carried to a point past the outside of the substrate table 4.

Figure 2:
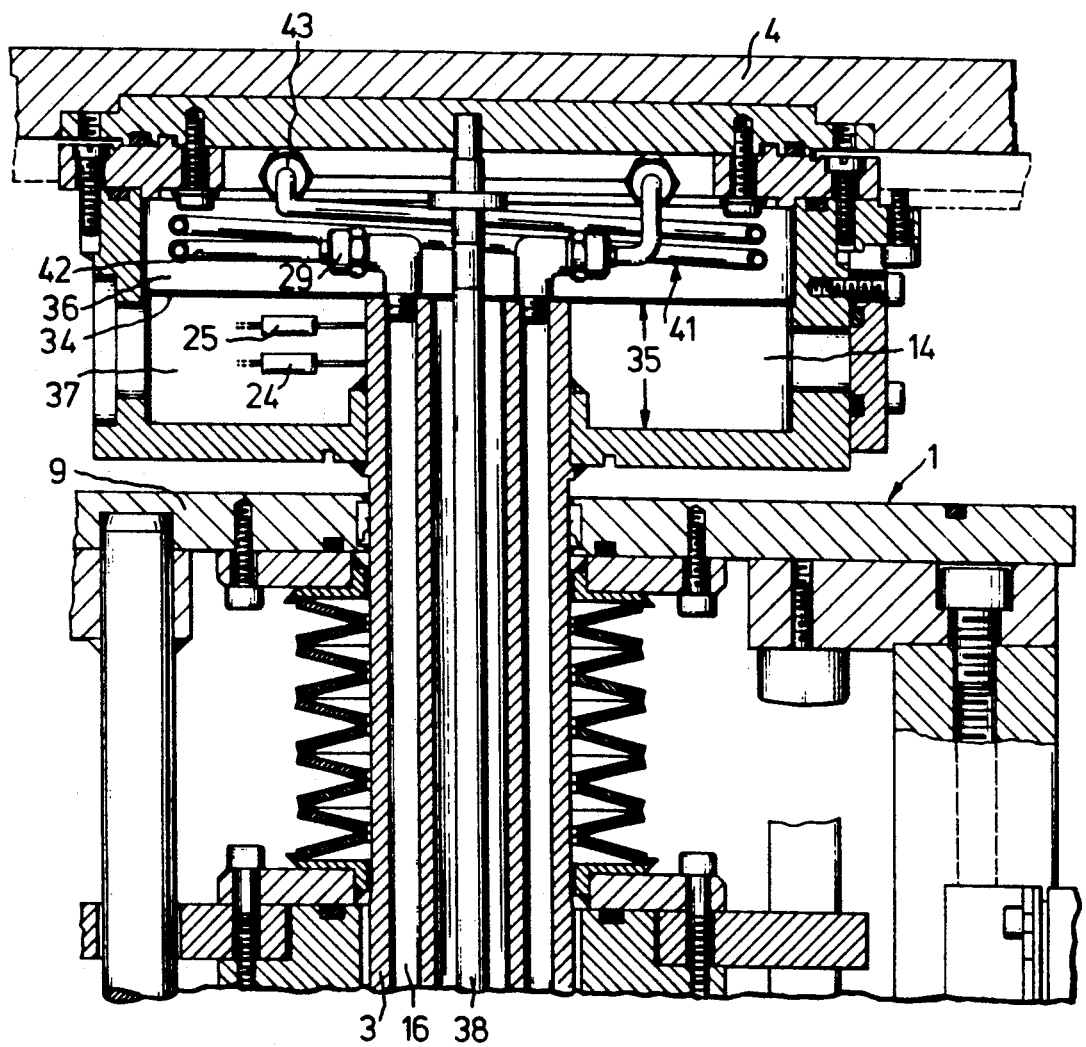
FIG. 2, is a vertical section through a second embodiment of substrate table and adjacent components.

In the embodiment according to FIG. 2, the shaft 3 has an end section 35 leading into the atmosphere container 14 and against a dividing wall 34 provided therein. The dividing wall 34 divides the atmosphere container 14 into two chambers 36 and 37 lying one over the other. A high-frequency feeder 38 runs through the shaft 3 to the substrate table 4. The dividing wall 34 brings it about that the lower chamber 37 is not affected by high-frequency, so that the high-frequency sensitive electrical connectors 24 and 25 can be provided therein.

In the upper chamber 36 can be seen the fitting 29 from which a water hose 42 having at least one spiral 41 leads to a water fitting 43 on the substrate table 4. The upper chamber 36 thus does not contain any high-frequency sensitive parts.

I claim:
1. Vacuum coating apparatus comprising
a vacuum tank comprising a wall,
a rotatably mounted shaft comprising a first portion passing sealingly through said wall and a second portion in said tank, said first portion having axial passage means therein, said second portion having a larger diameter than said first portion and having therein a chamber connected to said axial passage means, and
a substrate table mounted on said second portion of said shaft and closing said chamber sealingly so that said chamber can be at atmospheric pressure while said vacuum tank is evacuated.

2. Apparatus as in claim 1 further comprising
coolant feed means and coolant return means extending through said axial passage means, and
coolant distribution means in said chamber connected to said feed means and said return means.

3. Apparatus as in claim 2 wherein said coolant distribution means comprises fittings.

4. Apparatus as in claim 1 further comprises dark space shield means in said tank adjacent to said second portion of said shaft and electrically insulated from said wall.

5. Apparatus as in claim 1 further comprising high frequency power supply means running coaxially through said shaft and connected to said substrate table.

6. Apparatus as in claim 5 wherein said first portion comprises an end section extending into chamber, said apparatus further comprising a dividing wall in said chamber, said dividing wall separating said chamber into a lower portion containing said end section and an upper portion between said end section and said substrate table.

7. Apparatus as in claim 6 further comprising
coolant supply means through said axial passage means in said first portion, and
coolant distribution means for said substrate table in said upper portion of said chamber and connected to said supply means.

8. Apparatus as in claim 6 wherein said high frequency power supply means comprises connectors in said lower portion of said chamber.

9. Apparatus as in claim 1 further comprising at least one of coolant supply means and electrical power supply means in said axial passage means.

* * * * *